United States Patent
Jeter et al.

(10) Patent No.: US 6,639,798 B1
(45) Date of Patent: Oct. 28, 2003

(54) AUTOMOTIVE ELECTRONICS HEAT EXCHANGER

(75) Inventors: Michael A Jeter, Kokomo, IN (US); Roger A Mock, Kokomo, IN (US); Erich W Gerbsch, Cicero, IN (US); Jeffrey J. Ronning, Tipton, IN (US); Ralph S. Taylor, Noblesville, IN (US); Andrew R. Hayes, Clarence Center, NY (US)

(73) Assignee: Delphi Technologies, Inc., Troy, MI (US)

( * ) Notice: Subject to any disclaimer, the term of this patent is extended or adjusted under 35 U.S.C. 154(b) by 0 days.

(21) Appl. No.: 10/178,136

(22) Filed: Jun. 24, 2002

(51) Int. Cl.[7] ................................. H05K 7/20
(52) U.S. Cl. ............ 361/699; 361/698; 361/702; 361/704; 174/15.1; 165/80.4
(58) Field of Search ............... 361/689, 690, 361/698, 699, 700; 257/714, 718, 719, 721, 722, 727; 174/15.1, 16.1, 16.3; 165/80.4, 104.33

(56) References Cited

U.S. PATENT DOCUMENTS

| | | | | |
|---|---|---|---|---|
| 5,159,529 A | * | 10/1992 | Lovgren et al. | 361/699 |
| 5,369,879 A | * | 12/1994 | Goeschel et al. | 29/837 |
| 5,473,508 A | * | 12/1995 | Porter et al. | 361/695 |
| 5,666,269 A | * | 9/1997 | Romero et al. | 361/699 |
| 5,835,345 A | * | 11/1998 | Staskus et al. | 361/699 |
| 5,841,634 A | * | 11/1998 | Visser | 361/699 |
| 5,915,463 A | * | 6/1999 | Romero et al. | 165/80.3 |
| 6,046,905 A | * | 4/2000 | Nelson et al. | 361/704 |
| 6,418,019 B1 | * | 7/2002 | Snyder et al. | 361/700 |
| 6,434,003 B1 | * | 8/2002 | Roy et al. | 361/699 |
| 6,457,514 B1 | * | 10/2002 | Fumi | 165/80.4 |

* cited by examiner

Primary Examiner—Boris Chervinsky
(74) Attorney, Agent, or Firm—Jimmy L. Funke; Stefan V. Chmielewski

(57) ABSTRACT

An electronics assembly 10 is provided, including a housing 12 and at least one electronic power device 18 positioned within. A heat sink device 34 is positioned within the housing 12 and is in thermal communication with the electronic power device 18. The heat sink device 34 includes a fluid vessel 44, a fluid input port 50, a fluid output port 52, and at least one fin insert 60 brazed into the fluid vessel 44. The heat sink device 34 is in fluid communication with an automotive radiator 46 such that coolant 48 flows from the automotive radiator 46 through the fluid vessel 44 thereby cooling the electronic power device 18.

24 Claims, 3 Drawing Sheets

AUTOMOTIVE ELECTRONICS HEAT EXCHANGER

TECHNICAL FIELD

The present invention relates generally to a heat exchanger for use with automotive electronics. More specifically, the present invention relates to a fluid heat exchanger for use in cooling high power automotive electronics.

BACKGROUND OF THE INVENTION

Electronic components have had an increasingly diverse role in automotive design technology. Specialized components and/or applications have been incorporated into a wide variety of automotive functions. Often these functions can vary, including traditional automotive functionality, increased safety features, and increased performance features. In one recent genre of automotive design, namely hybrid-electric and pure electric vehicles, electronic components have assumed even the most fundamental roles of automotive functionality. Although, as mentioned, these electronic components and systems may be implemented to increase functionality, performance and safety over prior designs, they carry with them their own set of design concerns that must be addressed to insure proper operation of the vehicle under a variety of conditions.

One such design consideration that must be addressed stems from the tendency of electronic components and assemblies to generate thermal energy during operation. This thermal energy, created as a by-product of operation, must often be dissipated or transferred away from the electronics in order to insure the electronic components continue to operate as intended. Failure to adequately address thermal energy dissipation can lead to potential malfunctioning or damage in some electrical component scenarios. Hybrid-electric and pure-electric vehicle designs have lead to the use of high power electrical components that further require considerable heat dissipation that conventional electronic heat sink assemblies often are inadequate to address.

In an effort to address the heat dissipation requirements of such electric vehicle electronics, designs have turned to the use of automotive anti-freeze solutions to effectuate the cooling of electronics within the vehicle. The dissipation requirements when taken in light of prior art designs, however, often placed considerable limitations on system costs and performance. Prior systems, for example, often required that the circulating anti-freeze solution be continuously circulated at temperatures less than 70 degrees Centigrade. This can lead to tight design requirements and costly performance parameters imposed on the entire cooling assembly. Power electronic devices were often traditionally mounted with cast machined metal heat sink containing specifically designed fluid passages. This too was known to result in increased design and manufacturing costs. Finally, in order to achieve higher convective heat transfer effects of the fluid flowing through the passage, prior art designs often relied on intricate, staggered fin patterns machined or cast into the internal surfaces of the heat sink. The process of casting or machining these fins was known to add cost to the design and manufacturing and was known to become prohibitive as the design performance requirements increased.

In addition to increasing design complexity and cost, prior art approaches towards cooling of electric vehicle electronics have often created other concerns for design engineers. As is fundamentally obvious in many applications, liquid cooling fluid and electrical circuitry are not intended to come into contact. Heat sink assembly designs, therefore, must often take considerable care to insure contact does not occur during operation of the vehicle. Results of such contact during operation are known to result in improper operation or failure of the electronic circuitry. Despite these concerns, prior designs often utilized large access covers that were subject to flexure and eventual leakage or seal violation due to cycling internal pressures. A design utilizing a smaller containment perimeter in order to reduce the overall susceptibility to high fluctuating pressures would therefore be highly desirable.

It would therefore be highly desirable to have an automotive electronics heat exchanger that reduced the high fabrication costs associated with traditional machining and casting methodologies. In addition, it would be highly desirable to have an automotive electronics heat exchanger that reduced the susceptibility to leakage or seal violation. Finally, a design that reduced weight and allowed for a smaller overall electronics packaging volume would be additionally beneficial.

SUMMARY OF THE INVENTION

It is, therefore, an object of the present invention to provide an improved heat exchanger for use in automotive electronics. It is a further object of the present invention to provide a heat exchanger for use in automotive electronics with reduced fabrication costs and improved performance.

In accordance with the objects of the present invention, an automotive electronics assembly is provided. The electronics assembly includes a housing containing at least one electronic power device. A heat sink device is positioned within the housing and is in thermal communication with the at least one electronic power device. The heat sink device includes a fluid input port in fluid communication with a coolant. A fluid vessel is in communication with the fluid input port such that the coolant flows from the fluid input port, through the fluid vessel, and into a fluid output port. The heat sink device includes at least one fin insert positioned within the fluid vessel. Thermal energy generated by the at least one electronic power device is thereby transferred to the heat sink device and dissipated away into the flowing coolant.

Other objects and features of the present invention will become apparent when viewed in light of the detailed description of the preferred embodiment when taken in conjunction with the attached drawings and appended claims.

DESCRIPTION OF THE PREFERRED EMBODIMENT(S)

Figure 1:
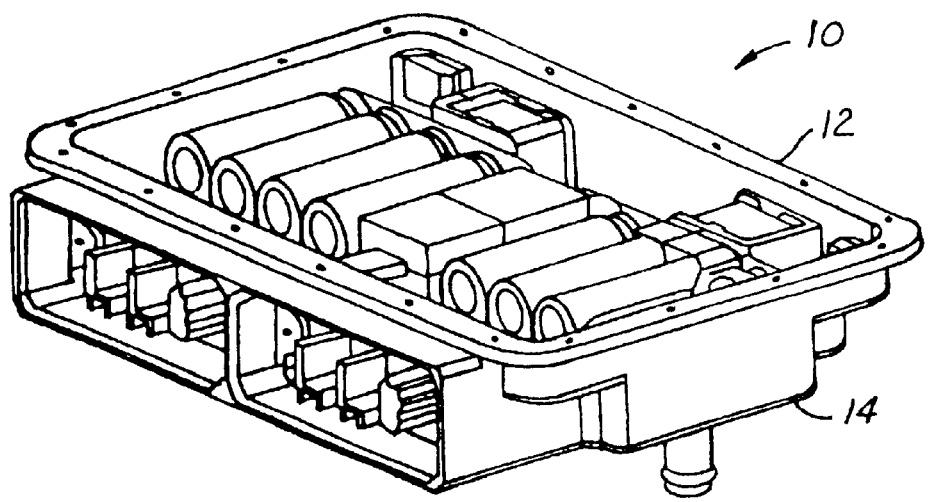
FIG. 1 is an illustration of an embodiment of an electronics assembly in accordance with the present invention.
Figure 3:
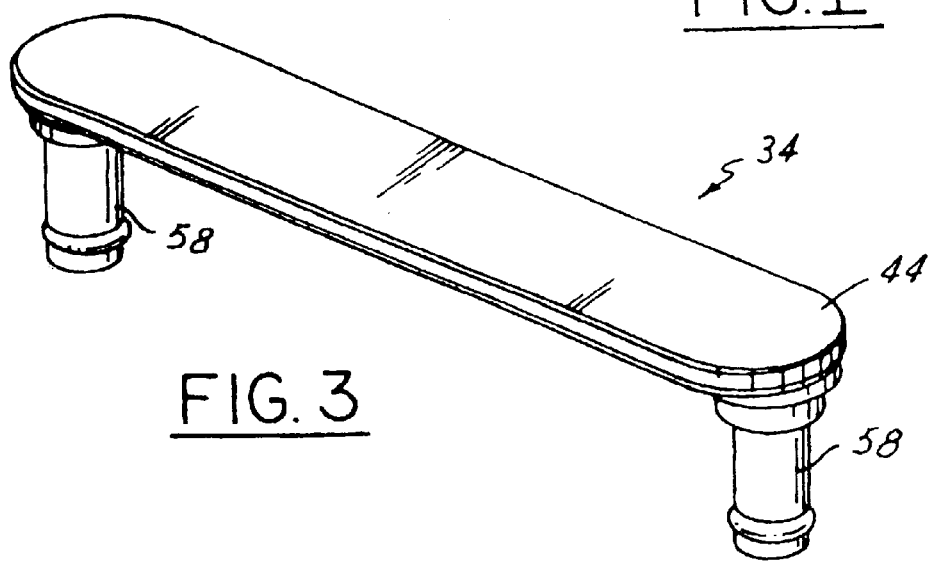
FIG. 3 is a detail illustration of a heat sink device for use in the electronics assembly illustrated in FIG. 1.

Referring now to FIG. 1, which is an illustration of an electronics assembly 10 in accordance with the present invention. Although the electronics assembly 10 is intended for use within an automobile, and more particularly a hybrid vehicle, it should be understood that the present invention would be applicable to a wide variety of applications including non-automotive applications.

Figure 2:
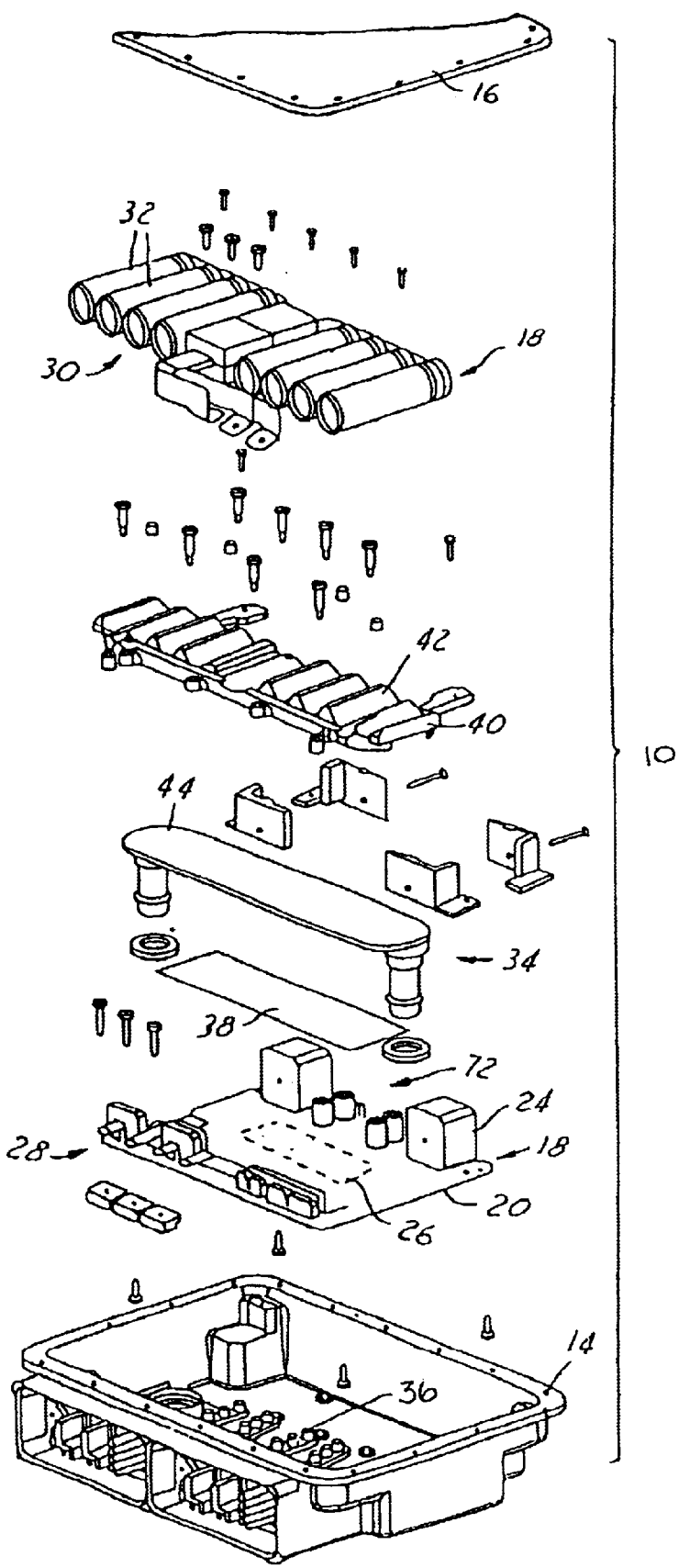
FIG. 2 is an exploded view illustration of the electronics assembly illustrated in FIG. 1.

The electronics assembly 10 includes a housing 12 having a lower housing portion 14 and an upper housing portion 16 (see FIG. 2). The electronics assembly 10 further includes at least one electronic power device 18 positioned within the housing 12. The housing 12 is intended to serve a variety of functions, one of which is to protect the at least one electronic power device 18 from damage when installed and operated within the automotive environment. Although the at least one electronic power device 18 may encompass a wide variety of configurations and/or components, in the embodiment illustrated the at least one power device 18 includes a circuit board 20 and a plurality of electronic components 22 mounted on the circuit board 20. The at least one electronic power device 18 may further include items such as inductors 24 and IC packages 26. Although the present invention can be utilized with a single electronic power device 18, it may additionally be utilized to provide cooling to a plurality of electronic power devices 18. FIG. 1 illustrates the present invention configured to provide cooling to a lower electronic power device 28 and an upper electronic power device 30. The upper electronic device 30 is illustrated as capacitors 32, although it is intended to encompass any heat generating electronic device or devices.

The present invention provides cooling to the electronic power device(s) 18 through the use of a heat sink device 34 positioned within the housing 12 and in thermal communication with the electronic power device(s) 18. It is contemplated that thermal communication between the electronic power device(s) 18 and the heat sink device 34 may be provided through a number of methods. One configuration contemplates the use of elastomeric pads 36, or similar spring devices, mounted on the housing 12 and positioned between the lower electronic power device 28 and the housing 12. A thermal interface material 38, such as a thermal adhesive strip, is positioned between the lower electronic power device 28 and the heat sink device 34. A clamp element 40 can then be utilized to insure proper thermal conductivity by pressing the heat sink device 34 to the lower electronic power device 28. Additionally, the clamp element 40 can be utilized to provide thermal conductivity between the heat sink device 34 and the upper electronic power device 30. Although this may be accomplished in a variety of fashions, such as an interface material, one embodiment contemplates the use of a contoured face 42 fashioned to adequately thermally engage the upper electronic power device 30.

Figure 6:
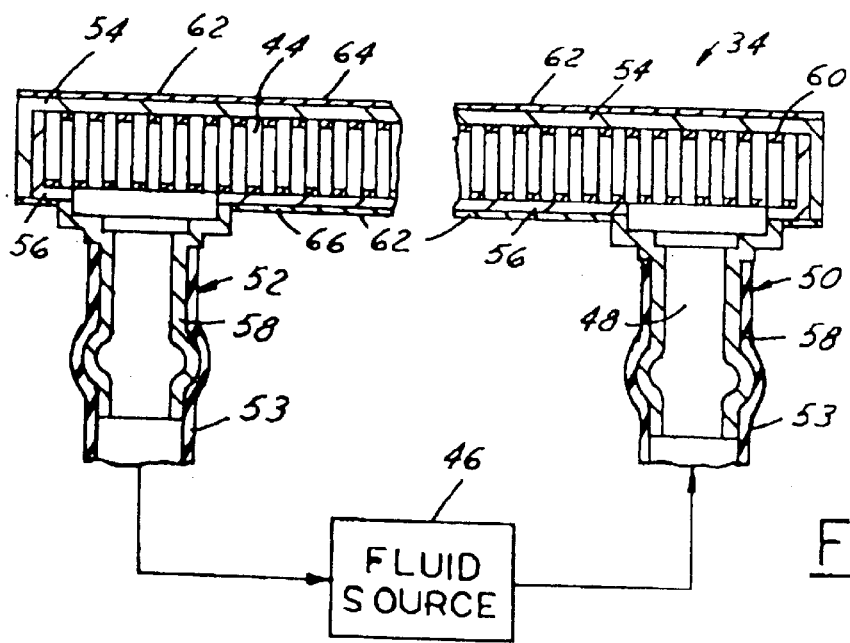
FIG. 6 is a cross-sectional illustration of the heat sink device illustrated in FIG. 3, the cross-section taken along the lines 6—6 and in the direction of the arrows.

The lower and upper electronic power devices (28,30) are maintained within proper operating temperatures by dissipating excess thermal energy into the heat sink device (34). The heat sink device (34) functions to transfer this thermal energy away through the use of a fluid vessel (44) in fluid communication with a coolant supply (46), such as an automotive radiator (see FIG. 6). Coolant (48), such as anti-freeze solutions, is transferred to/from the fluid vessel (44) to the coolant supply (46) and thereby allows the heat sink device (34) to continually dissipate thermal energy. Although the coolant (48) may be transported to/from the heat sink device (34) in a variety of fashions, one embodiment contemplates the use of hose elements (53). In order to accommodate the flow, the heat sink device further includes a fluid input port (50) and a fluid output port (52). This allows the coolant (48) to be routed through the fluid vessel (44).

Figures 4, 5:
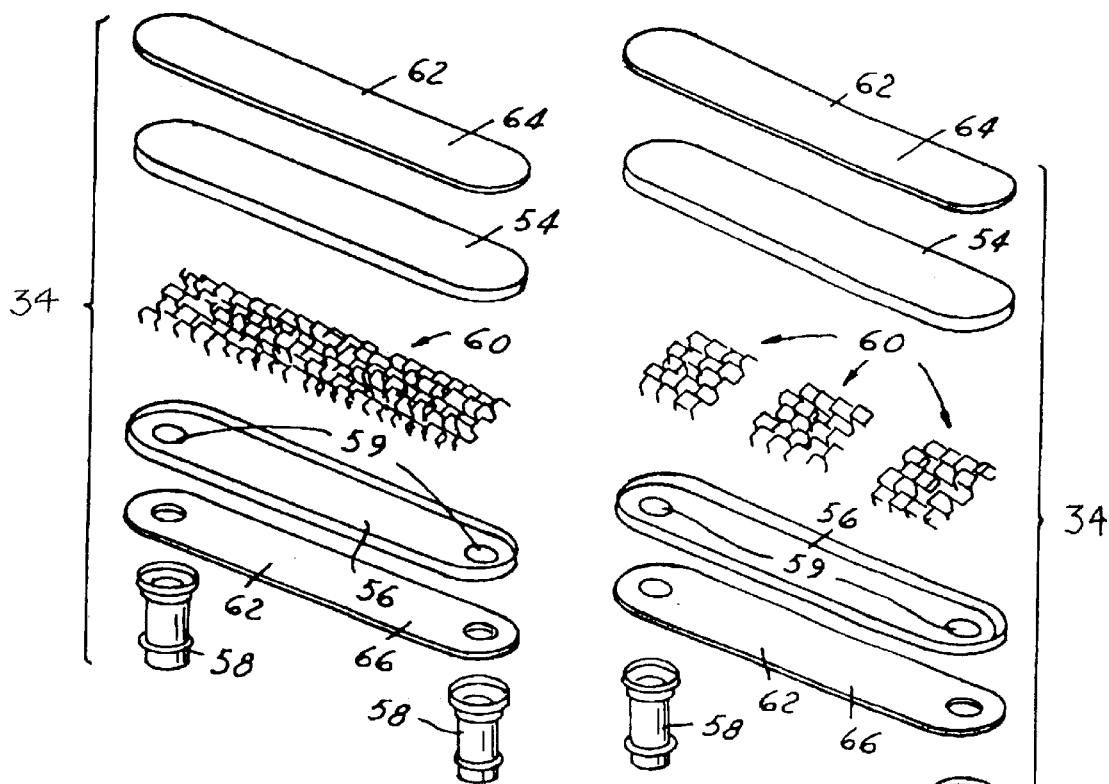
FIG. 4 is an exploded view illustration of an embodiment of the heat sink device illustrated in FIG. 3.
FIG. 5 is an exploded view illustration of an embodiment of the heat sink device illustrated in FIG. 3.

A novel aspect of the present invention stems from the physical structure of the heat sink device 34. The heat sink device 34 is preferably constructed utilizing a plurality of individual parts joined in a brazing process. The individual parts are preferably formed using a stamping process. The stamping/brazing construction of the present invention provides unique benefits by creating surfaces that do not require machining. This can provide a cost/time benefit over prior art cast designs. It should be understood, however, that precise numbers of parts or manufacturing procedures need not be utilized to implement the present invention. The fluid vessel 44 is preferably constructed utilizing a upper containment plate 54 and a lower containment plate 56 (see FIG. 4). These two containment plates 54, 56 are joined using a brazing process to form the fluid vessel 44. Hose barb fluid fittings 58 can be brazed onto the fluid vessel 44 incident with vessel ports 59 formed within the lower containment plate 56 in order to create the heat sink's 34 fluid input port 50 and fluid output port 52. The Hose barb fittings 58 can be utilized to facilitate easy connection to the coolant supply 46. It is contemplated that they will extend through the lower housing portion 14 to allow access after completed assembly of the electronics assembly 10.

The heat sink device 34 further includes at least one fin insert 60 brazed within the fluid vessel 44. The at least one fin insert 60 serves to stir up the coolant 48 flowing through the fluid vessel 44 as well as multiply its internal wetted surface area. By brazing the at least one fin insert 60 into the fluid vessel 44, the fabrication costs of the heat sink device 34 can be minimized and provide beneficial improvement over some prior cast, machined, or drilled designs. Although a single embodiment of a fin insert 60 has been illustrated, a wide variety of configurations are contemplated. The fin insert 60 is preferably manufactured using folded-fin technology common in the automotive oil-cooler industry. Although oil-cooler technology has made use of similar fins, the present invention allows for the use of fin inserts 60 manufactured using increased metal stock. This use of thicker metal stock takes better advantage of better fluid properties of the coolant 48 as well as allowing thermal energy to be carried away more effectively. Additionally, while the fin insert 60 can be manufactured from aluminum, it is preferably fabricated in copper due to the better fluid properties of the coolant 48 as well as the extreme high heat flux levels that can be generated in the electronics assembly 10.

Figure 7:
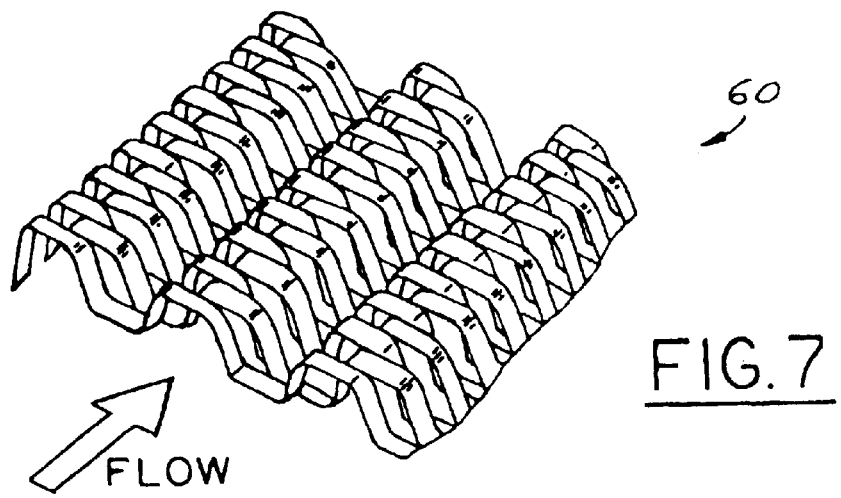
FIG. 7 is a detail illustration of an embodiment of a fin insert for use in the heat sink device illustrated in FIG. 3.

Heat dissipation for automotive electronics often requires high flow rates of the coolant 48. Configuration of the at least one fin insert 60 in an open-flow configuration (see FIG. 7) such that resistance to flow of coolant 48 through the at least one fin insert 60 is minimized allows for increased flow rates. Additionally, while the at least one fin insert 60 may be formed to encompass a majority of the fluid vessel 44 (see FIG. 4), in alternate embodiments a plurality of fin inserts 60 may be utilized such that they are located only where specifically required for heat conduction from the electronic power devices 18 (see FIG. 5). The use of multiple fin inserts 60, only where required, can be useful in minimizing the associated drag on the coolant 48. Combined with the use of large diameter fluid input ports 50 and fluid output ports 52, restriction of flow through the heat sink device 34 can be minimized.

The present invention can further include heat-spreading reinforcement plates 62 brazed onto the fluid vessel 44 in order to produce a highly reliable flat surface for interfacing with high heat flux electronics as well as for spreading the heat into the fluid vessel 44. The heat spreading reinforcement plates 62 are preferably stamped such that the highly reliable flat surfaces can be achieved without machining. The heat spreading reinforcement plates 62 preferably take the form of an upper heat-spreading reinforcement plate 64 and a lower heat-spreading reinforcement plate 66 brazed onto the outer surface of the fluid vessel 44. The heat-spreading reinforcement plates 62 can be manufactured from a variety of materials, although in one embodiment copper is contemplated. The use of these plates 62 can serve to make the present invention more rigid and thus help specific design usages achieve more uniform dimensional tolerances. Although the heat spreading reinforcement plates 62 can provide these benefits, it should be understood that a similar effect can be accomplished by increasing the gauge of the fluid vessel 44 without the need for the plates 62. This embodiment, in turn, would reduce part count.

The use of the multi-part heat sink device 34 fabricated utilizing brazing techniques allows for inexpensive construction. The flow of coolant 48 through the uniquely designed heat sink device 34 further can provide improvements in performance allowing use with anti-freeze solution having increased temperatures. The present invention thereby can achieve improvements in performance over sophisticated prior art heat sinks while additionally providing a reduction in fabrication costs.

While particular embodiments of the invention have been shown and described, numerous variations and alternative embodiments will occur to those skilled in the art. Accordingly, it is intended that the invention be limited only in terms of the appended claims.

What is claimed is:

1. An electronics assembly (10) comprising:
   a housing (12);
   at least one lower electronic power device (18) positioned within said housing (12);
   at least one upper electronic power device (30) positioned within said housing (12); and
   a heat sink device (34) positioned within said housing (12), between said at least one lower electronic power device (18) and said at least one upper power device (30), and in thermal communication with both said at least one lower electronic power device (18) and said at least one upper power device (30), said heat sink device (34) including a fluid vessel (44), a fluid input port (50), a fluid output port (52), and at least one fin insert (60) positioned within said fluid vessel (44), said heat sink device (34) in communication with a radiator (46) such that anti-freeze (48) from said radiator flows through said fluid vessel (44).

2. An electronics assembly (10) as described in claim 1, wherein said heat sink device (34) includes at least one heat-spreading reinforcement plate (62) brazed onto said fluid vessel (44).

3. An electronics assembly (10) as described in claim 1, wherein said at least one fin insert (60) is brazed into said fluid vessel (44).

4. An electronics assembly (10) as described in claim 1, further comprising:
   a first hose barb fluid fitting (58) is brazed onto said fluid input port (50); and
   a second hose barb fluid fitting (58) is brazed onto said fluid output port (52).

5. An electronics assembly (10) as described in claim 4, wherein said first hose barb fluid fitting (58) and said second hose barb fluid fitting (58) extend outside said housing (12).

6. An electronics assembly (10) as described in claim 1, further comprising:
   at least one elastomeric pad (36) mounted on said housing (12) and positioned between said at least one lower electronic power device (18) and said housing (12); and
   a clamp element (40) pressing said heat sink device (34) into thermal communication with said at least one lower electronic power device (18).

7. An electronics assembly (10) as described in claim 6, further comprising:
   a thermal interface material (38) positioned between said heat sink device (34) and said at least one lower electronic power device (18).

8. An electronics assembly (10) as described in claim 1, wherein said at least one fin insert (60) comprises two or more fin inserts (60) brazed into independent locations within said fluid vessel (44).

9. An electronics assembly (10) as described in claim 1, wherein said at least one fin insert (60) is orientated within said fluid vessel (44) to provide minimal resistance to said anti-freeze (48) flowing through said fluid vessel (44).

10. An electronics assembly (10) as described in claim 1 wherein said at least one fin insert (60) comprises copper.

11. An electronics assembly (10) comprising:
    a housing (12);
    at least one lower electronic power device (18) positioned within said housing (12);
    a heat sink device (34) positioned within said housing (12) and in thermal communication with said at least one lower electronic power device (18), said heat sink device (34) including a fluid vessel (44), a fluid input port (50), a fluid output port (52), and at least one fin insert (60) positioned within said fluid vessel (44) said heat sink device (34) in communication with a radiator (46) such that anti-freeze (48) from said radiator flows through said fluid vessel (44);
    at least one elastomeric pad (36) mounted on said housing (12) and positioned between said at least one lower electronic power device (18) and said housing (12); and
    a clamp element (40) pressing said beat sink device (34) into thermal communication with said at least one lower electronic power device (18);
    wherein said clamp element (40) comprises a contoured face (42) coincident with an upper electronic power device (30) such that said contoured face (42) thermally engages said upper electronic power device (30).

12. An electronics assembly (10) as described in claim 11, further comprising:
    a first hose barb fluid fitting (58) is brazed onto said fluid input port (50); and
    a second hose barb fluid fitting (58) is brazed onto said fluid output port (52).

13. An electronics assembly (10) as described in claim 12, wherein said first hose barb fluid fitting 58 and said second hose barb fluid fitting 58 extend outside said housing 12.

14. An electronics assembly (10) as described in claim 11, further comprising:
    at least one elastomeric pad (36) mounted on said housing (12) and positioned between said at least one lower electronic power device (18) and said housing (12); and
    a clamp element (40) pressing said heat sink device (34) into thermal communication with said at least one lower electronic power device (18).

15. An electronics assembly (10) as described in claim 11, wherein said at least one fin insert (60) comprises two or more fin inserts (60) brazed into independent locations within said fluid vessel (44).

16. An automotive heat sink device (34) for cooling a lower automotive electronic power device (18) and an upper automotive electronic power device (30) comprising:

a fluid vessel (44) positioned between and in thermal communication with the lower automotive electronic power device (18) and the upper automotive electronic power device, said fluid vessel (44) and the lower automotive power device (18) and the upper automotive power device (18) positioned within a housing (12);

a fluid input port (50) for providing coolant (48) from an automotive coolant supply (46) to said fluid vessel (44);

a fluid output port (52) for returning said coolant (48) from said fluid vessel (44) back to said automotive coolant supply (46), said fluid output port (52) extending outside said housing (12); and at least one fin insert (60) positioned within said fluid vessel (44), said at least one fin insert (60) dissipating thermal energy from said fluid vessel (44) into said coolant (48).

17. An automotive heat sink device (34) as described in claim 16, wherein said fluid vessel (44), said fluid input port (50), said fluid output port (52) and said at least one fin insert (60) are brazed together.

18. An automotive heat sink device (34) as described in claim 16 further comprising:

a first hose barb fluid (58) fitting brazed onto said fluid input port (50); and a second hose barb fluid (58) fitting brazed onto said fluid output (52) port.

19. An automotive heat sink device (34) as described in claim 16, further comprising:

at least one heat spreading reinforcement plate (62) brazed onto said fluid vessel (44).

20. An automotive heat sink device (34) as described in claim 16, wherein said fluid vessel (44) and said at least one fin insert (60) comprise copper.

21. An automotive heat sink device (34) as described in claim 16, further comprising:

a thermal interface material (38) positioned between said fluid vessel (44) and the lower automotive electronic power device (18).

22. An automotive heat sink device (34) as described in claim 16, wherein said at least one fin insert (60) is formed using folded fin technology.

23. An automotive heat sink device (34) as described in claim 22, wherein said at least one fin insert (60) is oriented within said fluid vessel (44) to minimize resistance.

24. A method of cooling a lower automotive electronics power device (18), and an upper automotive electronics power device (30) comprising:

pumping coolant (48) from a radiator (46) to a fluid vessel (44) positioned between and in thermal communication with the lower automotive electronics power device (18) and the upper automotive electronics power device, said fluid vessel (44) and the lower automotive power device (18) and the upper automotive power device (18) positioned within a housing (12);

transferring thermal energy from said fluid vessel (44) into said coolant (48) utilizing at least one fin insert (60) brazed into said fluid vessel (44), said at least one fin insert (60) creating a thermal communication between said fluid vessel (44) and said coolant (48); and flowing said coolant (48) from said fluid vessel (44) back to said radiator (46).

* * * * *